United States Patent [19]
Fujimoto

[11] Patent Number: 6,145,055
[45] Date of Patent: Nov. 7, 2000

[54] CACHE MEMORY HAVING FLAGS FOR INHIBITING REWRITE OF REPLACEMENT ALGORITHM AREA CORRESPONDING TO FAULT CELL AND INFORMATION PROCESSING SYSTEM HAVING SUCH A CACHE MEMORY

[75] Inventor: Yukihiro Fujimoto, Kanagawa-ken, Japan

[73] Assignee: Kabushiki Kaisha Toshiba, Kawasaki, Japan

[21] Appl. No.: 09/084,380

[22] Filed: May 27, 1998

[30] Foreign Application Priority Data

May 27, 1997 [JP] Japan ..................................... 9-136954

[51] Int. Cl.[7] ................................................. G06F 12/00
[52] U.S. Cl. .......................... 711/128; 711/144; 711/133; 711/159; 714/42
[58] Field of Search ..................................... 711/128, 144, 711/133, 159; 714/42, 710, 733; 365/200, 201

[56] References Cited

U.S. PATENT DOCUMENTS

| | | | |
|---|---|---|---|
| 5,019,971 | 5/1991 | Lefsky et al. | 714/5 |
| 5,070,502 | 12/1991 | Supnik | 714/8 |
| 5,805,606 | 9/1998 | Robertson et al. | 714/718 |
| 5,835,504 | 11/1998 | Balkin et al. | 714/723 |
| 5,926,484 | 7/1999 | Takusagawa | 714/710 |

Primary Examiner—Eddie P. Chan
Assistant Examiner—Hong Kim
Attorney, Agent, or Firm—Foley & Lardner

[57] ABSTRACT

When a fault cell is found in an initial state at the time of power-on, LRU bit is rewritten so that the LRU bit does not take an entry corresponding to a fault cell as an object of updating and then a LRU write inhibit flag is set to inhibit a write in the fault cell. If a fault cell is found during operation, a valid bit corresponding to an entry corresponding to the fault cell is rewritten to invalid condition. Then the LRU bit is rewritten so that the LRU bit does not take an entry corresponding to the fault cell as an object of updating and then a LRU write inhibit flag is set to inhibit a write in the fault cell.

8 Claims, 3 Drawing Sheets

CACHE MEMORY HAVING FLAGS FOR INHIBITING REWRITE OF REPLACEMENT ALGORITHM AREA CORRESPONDING TO FAULT CELL AND INFORMATION PROCESSING SYSTEM HAVING SUCH A CACHE MEMORY

BACKGROUND OF THE INVENTION

1. Field of the Invention

This invention relates to a cache memory capable of avoiding a fault of a cell even after it is installed in a system and an information processing system having the same cache memory.

2. Description of the Prior Art

The cache memory has been used as a high-speed buffer memory to accelerate memory access of a microprocessor and large-capacity cache memories have been loaded on the microprocessor because of increased program volume and improvement of micromachining technology in recent years.

In integrated cache memory in which a cache system can be formed with a single chip as well, its capacity has been increased more and more.

A structure of the conventional cache memory will be described with reference to FIG. 1.

The cache memory shown in FIG. 1 is a 4-way set associative type cache memory, which includes four tag memory arrays 101 and four data memory arrays 102. The memory array of each way is accessed according to a result of decoding of address lower bits by an address decoder 103 and the content of each memory cell is read by a read/write circuit 104a. A tag address read by a read/write circuit 104b from the tag memory array 101 is compared with upper level bits of address by a comparator 105 provided on each way. If as a result of comparison, there exists a way in which both coincide with each other so that that way is hit, access data is stored in the hit way. Data read from the data memory array 102 and then hit is selected by a way selector 106 and output. On the other hand if no coincidence is detected in all the ways so that cache miss occurs, the access data does not exist in the cache memory and therefore, an external memory is accessed.

From the viewpoints of timely/spatial localization of the memory access, it is most advantageous for system performance that data having a high access frequency is stored in the cache memory. Thus, if a cache miss occurs, one data stored in the cache is expelled and replace action for storing new data is performed. In such a replace action, LRU (Least Recently Used) algorithm is frequently used to determine which way data should be expelled and replaced with new data.

According to this LRU algorithm, which data has not been accessed recently of data stored in the cache is stored by LRU bit 107 and if cache miss occurs, data in the LRU bit 107 is read by a read/write circuit 113 and a way in which data should be replaced is determined with reference to the LRU bit. If pseudo LRU algorithm is used in, for example, 4-way set associative type, the LRU bit requires three bits. The LRU bit (LRU [0], [1], [2]) is rewritten by the read/write circuit 113 and updated according to a hit way as shown in Table 1 when it is hit.

TABLE 1

| hit way | LRU [0] | LRU [1] | LRU [2] |
|---|---|---|---|
| 0 | 1 | — | 1 |
| 1 | 0 | — | 1 |
| 2 | — | 1 | 0 |
| 3 | — | 0 | 0 |

On the other hand, if a cache miss occurs, a way to be updated is determined with reference to the aforementioned LRU bit read by the read/write circuit 113 as shown in Table 2.

TABLE 2

| Update way | LRU [0] | LRU [1] | LRU [2] |
|---|---|---|---|
| 0 | 0 | X | 0 |
| 1 | 1 | X | 0 |
| 2 | X | 0 | 1 |
| 3 | X | 1 | 1 |

In the cache memory, fault rate of the cell has been increasing with a tendency of increased scale of the memory capacity, so that a drop of the yield rate has been problematic. Then, to rescue a few faulty cells, in some cases, a redundant circuit usually used in general purpose DRAM or SRAM or the like is provided in the cache memory. According to this method, as shown in FIG. 1, extra memory cells 108 are disposed in the direction of word line (or direction of bit line). Further, a spare decoder 109 and LRU bit 110 are provided corresponding to this extra memory cells 108, so that when a faulty cell is found, a word line (or bit line) corresponding to the faulty cell is separated and an address of this separated word line (or bit line) is allocated to the extra memory cell. Separation of word line (or bit line) and changeover of the address to the extra disposed memory cell are carried out by cutting, for example, a fuse element 111 by laser. As a result, a few faulty cells are rescued so that the faulty product having the faulty cells can be converted to a good product, thereby relaxing the reduction of the yield rate.

The redundant circuits extra provided separately from regular circuits as a rescue way for the faulty cell cannot be provided in a large quantity not to affect the tendency of expanding structure. For the reason, only the faulty cells of the same number as that of provided redundant circuits, that is, a small number of the faulty cells can be rescued. Thus, if more faulty cells occur than a number of the redundant circuits provided, all the faulty cells cannot be rescued and in this case, that entire cache memory becomes a faulty product.

In addition, although the aforementioned rescue way is effective for a cell fault which occurs just after production of the memory, this way cannot be applied to a case in which the cache memory is installed in a system.

SUMMARY OF THE INVENTION

Accordingly, the present invention has been achieved to solve the above problem and it is therefore an object of the invention to provide a cache memory capable of avoiding a failure of a memory by faulty cells regardless of a quantity of the faulty cells even after the same memory has been already installed in a system, and an information processing device provided with the same cache memory.

To achieve the above object, according to the present invention, there is provided a cache memory which employs plural-way set associative system and replaces data of a way specified by an algorithm for updating data based on previous reference record, comprising: reference history storage areas which are provided for each entry commonly to each way and updated according to the algorithm, indicate the previous reference record, and are referred to at the time of replace so as to indicate a way in which the data is to be replaced; and rewrite inhibit flags which are provided corresponding to the reference history storage areas to inhibit rewrite of the reference history storage areas, wherein when a fault entry is found in the initial state at the time of power-on, a reference history storage area corresponding to the fault entry is rewritten by an instruction from outside not so as to instruct a way of the fault entry, a rewrite inhibit flag corresponding to the rewritten reference history storage area is set and when the reference history storage area corresponding to the fault entry is updated, it is controlled that the reference history storage area is not rewritten so as to instruct the way of the fault entry.

Further to achieve the above object, according to the present invention, there is provided a cache memory which employs plural-way set associative system and replaces data of a way specified by an algorithm for updating data based on previous reference record, comprising: reference history storage areas which are provided for each entry commonly to each way and updated according to the algorithm, indicate the previous reference record, and are referred to at the time of replace so as to indicate a way in which the data is to be replaced; rewrite inhibit flags which are provided corresponding to the reference history storage areas to inhibit rewrite of the reference history storage areas, and validity/invalidity areas which are provided corresponding to each entry of each way to indicate validity/invalidity of storage contents of each entry, wherein when a fault entry is found during operation, the validity/invalidity area corresponding to the fault entry is rewritten by an instruction from outside to the invalid condition, the reference history storage area corresponding to the fault entry is rewritten not so as to instruct a way of the fault entry, the rewrite inhibit flag corresponding to the rewritten reference history storage area is set and when said reference history storage area corresponding to the fault entry is updated, it is controlled that the reference history storage area is not rewritten so as to instruct the way of the fault entry.

According to a preferred embodiment of the present invention, the cache memory according to a first aspect of the invention further comprises a built-in self test circuit for detecting a fault cell by supplying an address and test data at the time of power-on.

According to another preferred embodiment of the present invention, the cache memory according to a second aspect of the invention further comprises a built-in self test circuit for detecting a fault cell by supplying an address and test data at the time of power-on.

Still further to achieve the above object, there is provided an information processing system comprising: a cache memory according to the first aspect; and a processor in which the cache memory is tested using a test vector at the time of power-on, and if a fault cell is detected by the test, a reference history storage area corresponding to an entry of the detected fault cell is rewritten not so as to instruct a way of a fault entry, and a rewrite inhibit flag corresponding to the rewritten reference history storage area is set and when the reference history storage area corresponding to the fault entry is updated, it is controlled that the reference history storage area is not rewritten so as to instruct the way of the fault entry.

Still further to achieve the above object, there is provided an information processing system comprising: a cache memory according to the second aspect; and a processor wherein when a fault cell is found during operation, a validity/invalidity area corresponding to an entry of a detected fault cell is rewritten to invalid condition, a reference history storage area corresponding to the entry of the detected fault cell is rewritten not so as to instruct a way of a fault entry, the rewrite inhibit flag corresponding to the rewritten reference history storage area is set and when the reference history storage area corresponding to the fault entry is updated, it is controlled that the reference history storage area is not rewritten so as to instruct the way of the fault entry.

Yet still further to achieve the above object, there is provided an information processing system comprising: a cache memory according to the aforementioned preferred embodiment; and a processor wherein when a test result of the built-in self test circuit is received and a fault cell is detected as a result of the test, a reference history storage area corresponding to an entry of the detected fault cell is rewritten not so as to instruct a way of a fault entry, and a rewrite inhibit flag corresponding to the rewritten reference history storage area is set and when the reference history storage area corresponding to the fault entry is updated, it is controlled that the reference history storage area is not rewritten so as to instruct the way of the fault entry.

Yet still further to achieve the above object, there is provided an information processing system comprising: a cache memory according to the aforementioned preferred embodiment; and a processor wherein when a fault cell is found during operation, a validity/invalidity area corresponding to an entry of a detected fault cell is rewritten to invalid condition, a reference history storage area corresponding to the entry of the detected fault cell is rewritten not so as to instruct a way of a fault entry, the rewrite inhibit flag corresponding to the rewritten reference history storage area is set and when the reference history storage area corresponding to the fault entry is updated, it is controlled that the reference history storage area is not rewritten so as to instruct the way of the fault entry.

The nature, principle and utility of the invention will become more apparent from the following detailed description when read in conjunction with the accompanying drawings.

DESCRIPTION OF THE PREFERRED EMBODIMENTS

Hereinafter, the embodiment of the present invention will be described with reference to the accompanying drawings.

Figure 2:
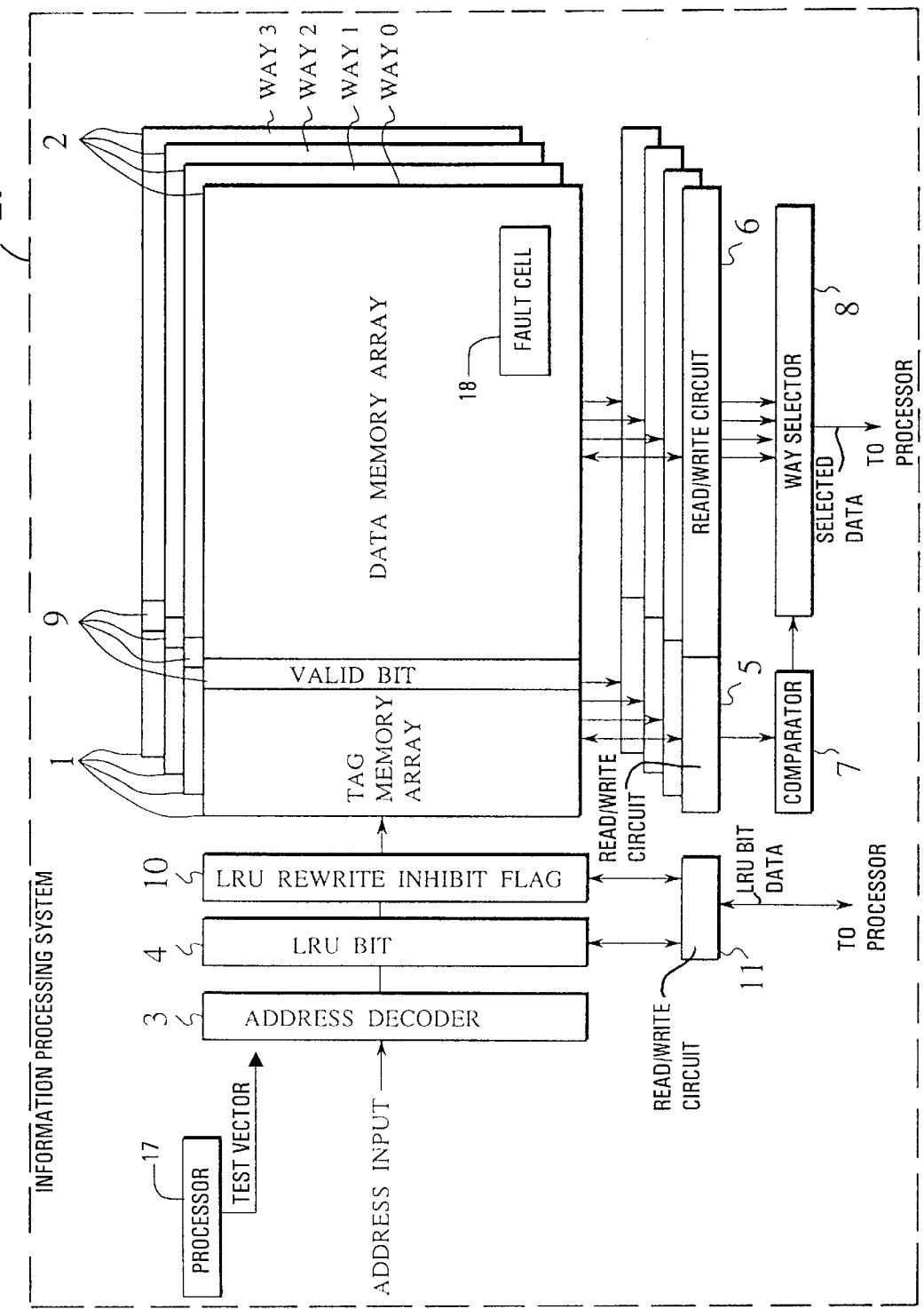
FIG. 2 is a diagram showing a structure of an information processing system according to an embodiment of the present invention.

FIG. 2 is a diagram showing a structure of an information processing system according to an embodiment of the present invention. The information processing system 21 comprises a cache memory and a processor 17.

Figure 1:
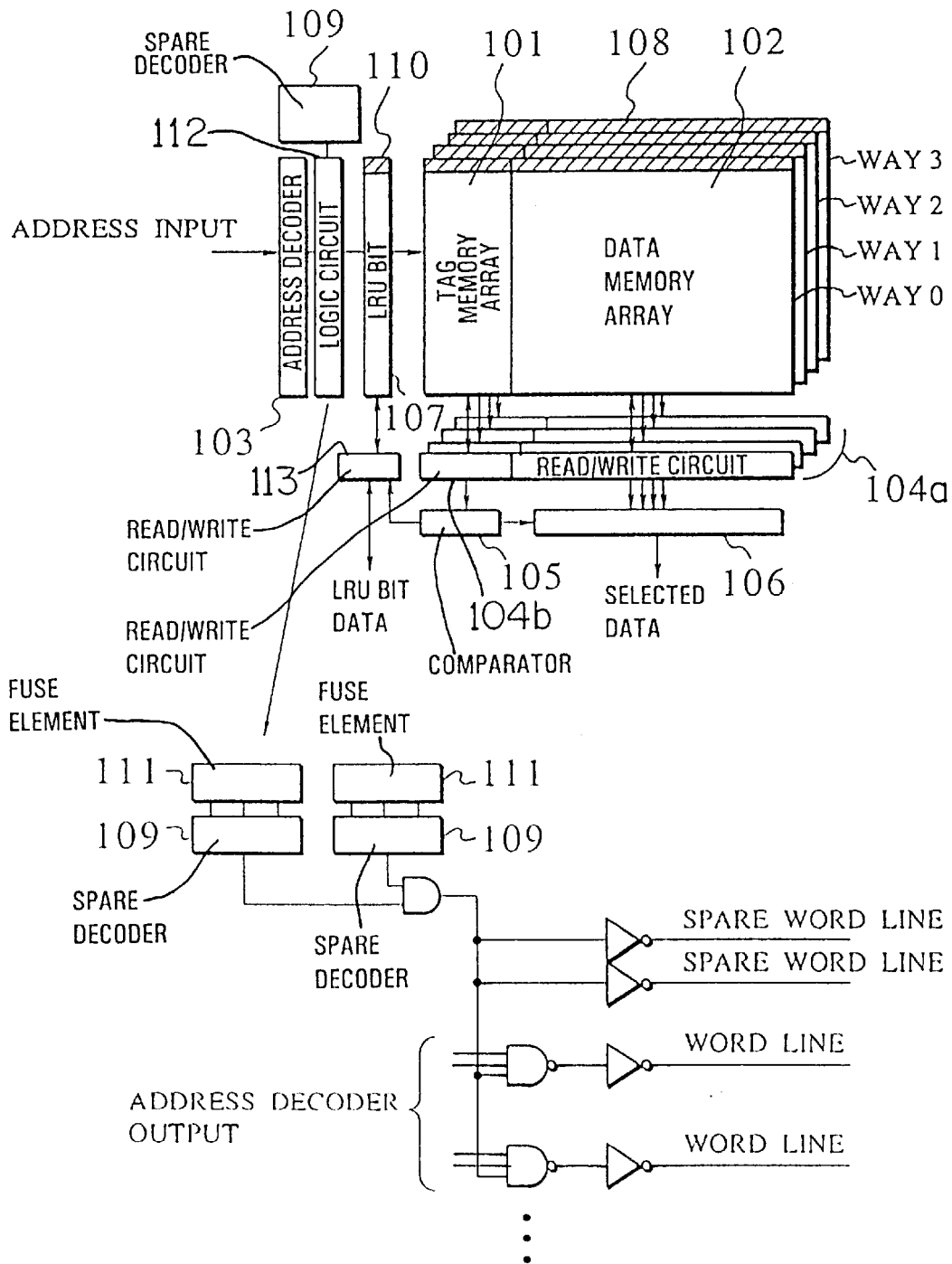
FIG. 1 is a diagram showing a structure of a conventional cache memory.

Referring to FIG. 2, the cache memory according to the present embodiment is 4-way set associative type cache memory comprising: tag memory arrays 1 for storing a tag address like the cache memory shown in FIG. 1; data memory arrays 2 for storing data corresponding to the tag address stored in the tag memory arrays 1; an address decoder 3 for decoding lower level address supplied from outside and accessing the tag memory arrays 1; LRU bits 4 which are provided for each entry commonly to each way, updated according to the LRU algorithm so as to indicate previous reference records, referred to at the time of replace and instructs a way in which data should be replaced; read/write circuits 5 for reading from or writing in the tag memory array 1; read/write circuits 6 for reading from or writing in the data memory array 2; a comparator 7 for comparing a upper level address supplied from outside with the tag address read from the tag memory array 1 to determine cache hit/cache miss; and a way selector 8 for selecting and reading data from a way hit according to a comparison result. The cache memory, which carries out replace according to the LRU (Least Recently Used) algorithm for updating data based on previous reference records, further comprises valid bits 9 which are provided on part of the tag memory array 1 and indicate validity/invalidity of data stored in the data memory array 2; LRU write inhibit flag 10 which is provided corresponding to the LRU bit 4 for inhibiting rewrite of the LRU bit 4; and read/write circuit 11 for reading from or writing in the LRU bit 4 or LRU write inhibit flag 10. If any fault entry is found when all data in the initial state are invalid upon power on of the cache memory, the LRU bit 4 corresponding to the fault entry is rewritten based on an instruction from outside so as not to instruct a way of the fault entry and then a LRU write inhibit flag 10 corresponding to this rewritten LRU bit 4 is set to control such that the LRU bit is not rewritten so as to instruct the way of the fault entry when the LRU bit 4 corresponding to the fault entry is updated. Additionally if a fault entry is found by parity check or the like during the operation of the cache memory, the valid bit 9 corresponding to the fault entry is rewritten to invalidity based on an instruction from outside. Further, the LRU bit corresponding to the fault entry is rewritten so as not to instruct the way of the fault entry and then the LRU write inhibit flag 10 corresponding to this rewritten LRU bit 4 is set to control such that the LRU bit is not rewritten so as to instruct the way of the fault entry when the LRU bit 4 corresponding to the fault entry is updated.

The LRU write inhibit flag 10 is provided as a 2-bit flag corresponding to LRU[0] and LRU[1] of 3-bit LRU bit 4 of the pseudo LRU algorithm for updating at the time of a hit or replace. That is, if the LRU write inhibit flag [0] is set, rewrite of the LRU[0] of the LRU bit 4 is inhibited, and if the LRU rewrite inhibit flag [1] is set, rewrite of the LRU[1] of the LRU bit 4 is inhibited.

Thus, if a fault cell is found in way 0, "1" is written in LRU[0] corresponding to an entry of the fault cell and then the LRU write inhibit flag [0] is set. If a fault cell is found in way 1, "0" is written in LRU[0] corresponding to an entry of the fault cell and then the LRU write inhibit flag [0] is set. If a fault cell is found in way 2, "1" is written in LRU[1] corresponding to an entry of the fault cell and the LRU write inhibit flag [1] is set. If a fault cell is found in way 3, "0" is written in LRU[1] corresponding to an entry of the fault cell and then the LRU write inhibit flag [1] is set.

Thus, if a fault cell is found in the initial state when the power is turned on, the LRU bit for instructing a way in which the fault cell is found as a way to be updated is rewritten so as not to update, so that a subsequent rewrite is inhibited. For example if a fault cell exists in way 0, the LRU[0] is rewritten to "1" so that upon updating at the time of replace, the LRU bit 4 instructs not way 0 but ways 1, 2 or 3. Further, the LRU write inhibit flag [0] is set so that this state is fixed. This is the same for ways 1–3.

Thus, because the LRU write inhibit flag is set in the initial state or in the state in which no valid data is written so that all entries are invalid, in a process in which data is gradually stored in the cache memory from its initial state, no write is performed in a way corresponding to the fault cell so that the way remain invalid. On the other hand, if a fault cell is found by parity check or the like during the operation, the valid bit 9 is rewritten to invalid state and then the LRU rewrite inhibit flag is set as described above. As a result, every read from this fault cell causes a cache miss. Thus, the way of an entry corresponding to this fault cell does not substantially function as a memory cell of the cache memory so that only that fault cell portion can be avoided.

Detection of a fault cell upon power-on is carried out using a test vector under a control of the processor 17 of a system containing this cache memory, for example, information processing system 21 as shown in FIG. 2. Updating of the LRU bit 4 and set/reset of the LRU rewrite inhibit flag 10 are carried out according to an instruction from the processor 17 of the system 21 based on a result of detection of the fault cell.

In such a cache memory, regardless of a quantity of the fault cells, it is possible to make the entire cache memory function as a good product by avoiding the fault cells. Further, even after the cache memory is installed in the system, this can be achieved easily. Further because the structure of the reading system for reading stored data is not different from that of a conventional one, the reading speed is not affected, so that the reading speed is not made lower as compared to a method for identifying a fault cell by referring to any information at the time of reading. Further, the structure size can be reduced as compared to the method for identifying a fault cell by providing each way of all ways with any information. For example in case when one way contains 256 entries and four ways are provided, if information of one bit is provided on each entry of the respective ways, 256×4=1024 bits is necessary. However, according to the present embodiment, because 2-bit LRU rewrite inhibit flag is provided for each entry common to the respective ways, 256×2=512 bits is used, so that the structure size can be halved. Further, because in the cache memory of the present embodiment, write is only inhibited so as to inhibit use of the fault cell, the circuit structure is simple and its control is easy.

Figure 3:
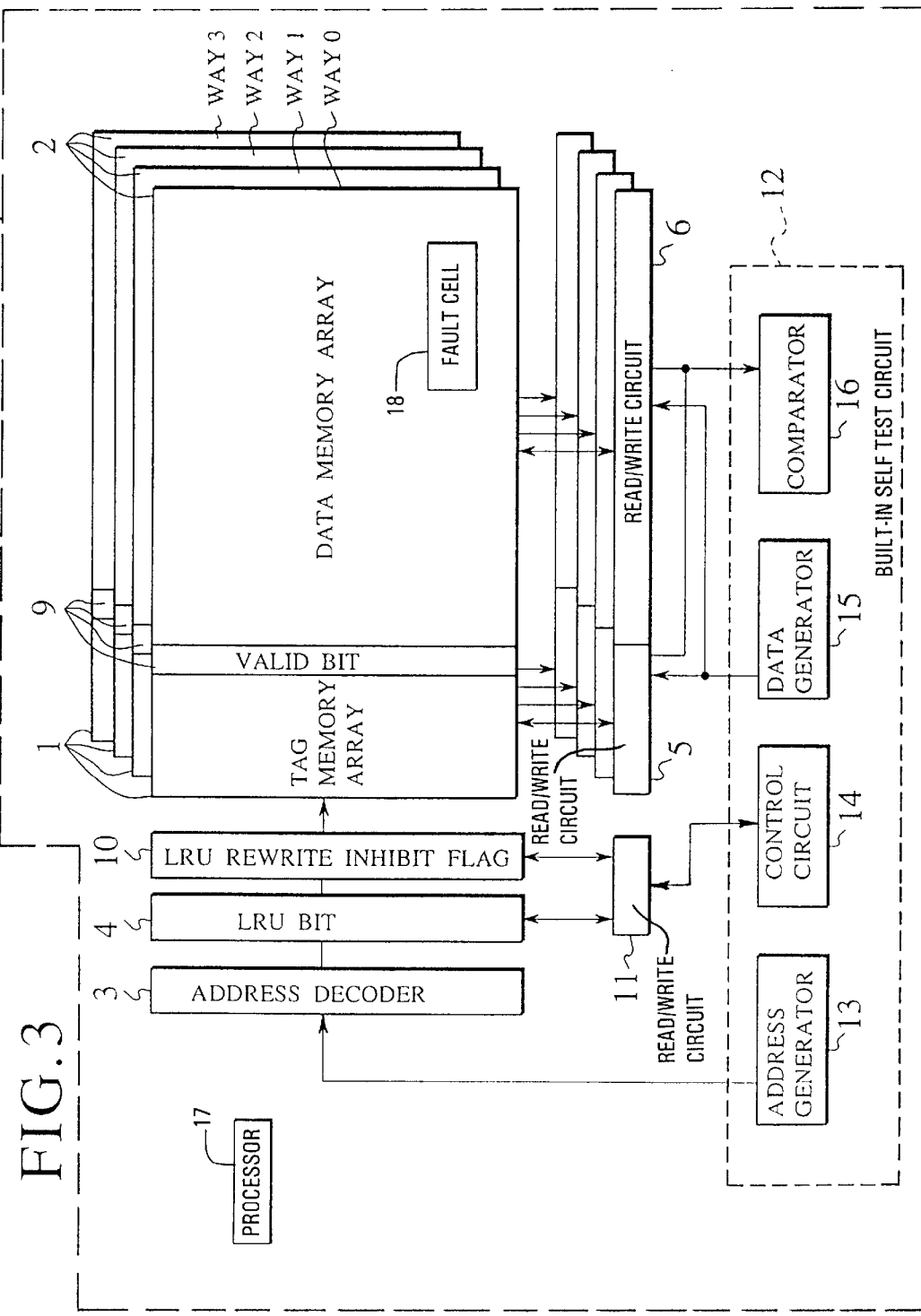
FIG. 3 is a diagram showing a structure of an information processing system according to another embodiment of the present invention.

FIG. 3 is a diagram showing a structure of the information processing system according to another embodiment of the present invention.

Referring to FIG. 3, a feature of the present embodiment exists in that as compared to the structure of the cache memory shown in FIG. 2, a built-in self test (BIST) circuit 12 is provided, an address is generated by an address generator 13 of the BIST circuit 12, data is generated from a data generator 15, the LRU bit 4 and LRU rewrite inhibit flag 10 are controlled by a control circuit 14 and a content read from the tag array 1 or data array 2 is compared with an expected value by a comparator 16 to detect a fault cell at the time of power-on. The other structure and operation are the same as the cache memory shown in FIG. 2.

In the present embodiment, in addition to the effect of the embodiment shown in FIG. 2, detection of a fault cell is enabled by the cache memory alone, so that this can be installed in a system having no fault cell detecting function also.

Meanwhile, the above described embodiment can be achieved by a complete LRU algorithm using 6-bit LRU bits instead of the pseudo LRU algorithm. Further, this is applicable to two ways and eight ways as well as four ways. The algorithm for updating data is not restricted to the LRU algorithm, but for example, other algorithm conventionally used such as FIFO or the like may be used.

As described above, according to the present invention, if a fault cell exists, in a state in which entry data corresponding to that fault cell is invalid, write into that entry is inhibited. Thus, it is possible to avoid the fault cells regardless of the quantity of the fault cells with a simple and small structure and easy control. Further, because the same reading system structure as conventional is employed, a reduction of data reading speed can be avoided.

It should be understood that many modifications and adaptations of the invention will become apparent to those skilled in the art and it is intended to encompass such obvious modifications and changes in the scope of the claims appended hereto.

What is claimed is:

1. A cache memory which employs plural-way set associative system and replaces data of a way specified by an algorithm for updating data based on previous reference record, comprising:

reference history storage areas which are provided for each entry commonly to each way and updated according to said algorithm, indicate the previous reference record, and are referred to at the time of replacement so as to indicate a way in which the data is to be replaced; and rewrite inhibit flags which are provided corresponding to said reference history storage areas to inhibit rewrite of said reference history storage areas, wherein when a fault entry is found in the initial state at the time of power-on, a reference history storage area corresponding to the fault entry is rewritten by an instruction from outside so as not to instruct a way of the fault entry, a rewrite inhibit flag corresponding to the rewritten reference history storage area is set and when the reference history storage area corresponding to the fault entry is updated, it is controlled that the reference history storage area is not rewritten so as to instruct the way of the fault entry.

2. The cache memory according to claim 1 further comprising a built-in self test circuit for detecting a fault cell by supplying an address and test data at the time of power-on.

3. An information processing system comprising:

a cache memory according to claim 2; and a processor wherein when a test result of said built-in self test circuit is received and a fault cell is detected as a result of the test, a reference history storage area corresponding to an entry of the detected fault cell is rewritten not so as to instruct a way of a fault entry, and a rewrite inhibit flag corresponding to the rewritten reference history storage area is set and when the reference history storage area corresponding to the fault entry is updated, it is controlled that the reference history storage area is not rewritten so as to instruct the way of the fault entry.

4. An information processing system comprising:

a cache memory according to claim 2; and a processor wherein when a fault cell is found during operation, a validity/invalidity area corresponding to an entry of a detected fault cell is rewritten to invalid condition, the reference history storage area corresponding to the entry of the detected fault cell is rewritten not so as to instruct a way of a fault entry, the rewrite inhibit flag corresponding to the rewritten reference history storage area is set and when the reference history storage area corresponding to the fault entry is updated, it is controlled that the reference history storage area is not rewritten so as to instruct the way of the fault entry.

5. An information processing system comprising:

a cache memory according to claim 1; and a processor in which the cache memory is tested using a test vector at the time of power-on, and if a fault cell is detected by the test, a reference history storage area corresponding to an entry of the detected fault cell is rewritten not so as to instruct a way of a fault entry, and a rewrite inhibit flag corresponding to the rewritten reference history storage area is set and when the reference history storage area corresponding to said fault entry is updated, it is controlled that the reference history storage area is not rewritten so as to instruct the way of the fault entry.

6. A cache memory which employs plural-way set associative system and replaces data of a way specified by an algorithm for updating data based on previous reference record, comprising:

reference history storage areas which are provided for each entry commonly to each way and updated according to said algorithm, indicate the previous reference record, and are referred to at the time of replacement so as to indicate a way in which the data is to be replaced;

rewrite inhibit flags which are provided corresponding to said reference history storage areas to inhibit rewrite of said reference history storage areas, and validity/invalidity areas which are provided corresponding to each entry of each way to indicate validity/invalidity of storage contents of each entry, wherein when a fault entry is found during operation, a validity/invalidity area corresponding to the fault entry is rewritten by an instruction from outside to the invalid condition, the reference history storage area corresponding to the fault entry is rewritten so as not to instruct a way of the fault entry, the rewrite inhibit flag corresponding to the rewritten reference history storage area is set and when the reference history storage area corresponding to the fault entry is updated, it is controlled that the reference history storage area is not rewritten so as to instruct the way of the fault entry.

7. The cache memory according to claim 6 further comprising a built-in self test circuit for detecting a fault cell by supplying an address and test data at the time of power-on.

8. An information processing system comprising:

a cache memory according to claim 6; and a processor wherein when a fault cell is found during operation, a validity/invalidity area corresponding to an entry of a detected fault cell is rewritten to invalid condition, a reference history storage area corresponding to the entry of the detected fault cell is rewritten not so as to instruct a way of a fault entry, a rewrite inhibit flag corresponding to the rewritten reference history storage area is set and when the reference history storage area corresponding to the fault entry is updated, it is controlled that the reference history storage area is not rewritten so as to instruct the way of the fault entry.

* * * * *